US012432960B2

(12) United States Patent
Xie et al.

(10) Patent No.: US 12,432,960 B2
(45) Date of Patent: Sep. 30, 2025

(54) WRAPAROUND CONTACT WITH REDUCED DISTANCE TO CHANNEL

(71) Applicant: International Business Machines Corporation, Armonk, NY (US)

(72) Inventors: Ruilong Xie, Niskayuna, NY (US); Reinaldo Vega, Mahopac, NY (US); Yao Yao, Albany, NY (US); Andrew M. Greene, Slingerlands, NY (US); Veeraraghavan S. Basker, Schenectady, NY (US); Pietro Montanini, Albany, NY (US); Jingyun Zhang, Albany, NY (US); Robert Robison, Rexford, NY (US)

(73) Assignee: International Business Machines Corporation, Armonk, NY (US)

(*) Notice: Subject to any disclaimer, the term of this patent is extended or adjusted under 35 U.S.C. 154(b) by 682 days.

(21) Appl. No.: 17/544,328

(22) Filed: Dec. 7, 2021

(65) Prior Publication Data

US 2023/0178621 A1    Jun. 8, 2023

(51) Int. Cl.
*H10D 30/00* (2025.01)
*H10D 30/67* (2025.01)
(Continued)

(52) U.S. Cl.
CPC ....... *H10D 30/501* (2025.01); *H10D 30/6735* (2025.01); *H10D 62/121* (2025.01); *H10D 62/151* (2025.01); *H10D 64/256* (2025.01); *H10D 84/013* (2025.01); *H10D 84/0149* (2025.01)

(58) Field of Classification Search
CPC ......... H01L 29/42392; H01L 29/41766; H01L 29/0847; H10D 30/501; H10D 62/151; H10D 64/256; H10D 30/6735
See application file for complete search history.

(56) References Cited

U.S. PATENT DOCUMENTS 9,461,171 B2   10/2016   Xie
9,806,194 B2   10/2017   Suk
(Continued)

FOREIGN PATENT DOCUMENTS

EP    3316316 A1    5/2018
WO    2023/103680 A1    6/2023

OTHER PUBLICATIONS

International Search Report and Written Opinion dated Jan. 23, 2023, for International Application No. PCT/CN2022/130557, filed Nov. 8, 2022.

*Primary Examiner* — Peter M Albrecht
(74) *Attorney, Agent, or Firm* — Matthew Zehrer

(57) ABSTRACT

A nanosheet semiconductor device includes channel nanosheets each connected to a source/drain region that has a front surface, a rear surface, and an internal recess between the front surface and the rear surface. The device further includes a source/drain region contact in physical contact with the V shaped internal recess, with the front surface, and with the rear surface. The device may be fabricated by forming the source/drain region, recessing the source/drain region, and by forming a sacrificial source/drain region upon and around the recessed source/drain region. The sacrificial source/drain region may be removed and the source/drain region contact may be formed in place thereof.

20 Claims, 10 Drawing Sheets

(51) Int. Cl.
*H10D 62/10* (2025.01)
*H10D 62/13* (2025.01)
*H10D 64/23* (2025.01)
*H10D 84/01* (2025.01)

(56) References Cited

U.S. PATENT DOCUMENTS

| | | |
|---|---|---|
| 9,847,390 B1 | 12/2017 | Xie et al. |
| 10,236,218 B1 | 3/2019 | Xie et al. |
| 10,269,914 B2 | 4/2019 | Wu |
| 10,651,091 B2 | 5/2020 | Wang |
| 10,714,597 B2 | 7/2020 | Huang |
| 11,011,622 B2 | 5/2021 | Bi |
| 2008/0001260 A1 | 1/2008 | Zhu |
| 2015/0318291 A1 | 11/2015 | Liu |
| 2017/0323963 A1 | 11/2017 | Gardner |
| 2018/0108667 A1 | 4/2018 | Chang |
| 2018/0269305 A1 | 9/2018 | Bao |
| 2020/0006525 A1 | 1/2020 | Crum |
| 2020/0013900 A1* | 1/2020 | Carr ............... H10D 64/256 |
| 2020/0020774 A1 | 1/2020 | Lee |
| 2020/0119002 A1* | 4/2020 | Xie ............... H10D 84/834 |
| 2020/0373391 A1* | 11/2020 | Yi ............... H10D 62/121 |
| 2021/0193829 A1* | 6/2021 | Reznicek ........... H01L 29/0847 |
| 2021/0202697 A1 | 7/2021 | Young |

* cited by examiner

WRAPAROUND CONTACT WITH REDUCED DISTANCE TO CHANNEL

BACKGROUND

Various embodiments of the present application generally relate semiconductor device fabrication methods and resulting structures. More specifically the various embodiments relate to a nanosheet field effect transistor (FET) device that includes a wraparound contact that has a reduced distance from the contact to the nanosheet FET channel.

SUMMARY

In an embodiment of the present invention, a nanosheet semiconductor device is presented. The device includes a plurality of channel nanosheets each connected to a source/drain region and a gate surrounding the plurality of channel nanosheets. The source/drain region includes a front surface, a rear surface, a top surface, and an internal recess comprising two or more sloped internal surfaces extending downward from the top surface. The device further includes a source/drain region contact in physical contact with the internal recess, in physical contact with the front surface, and in physical contact with the rear surface of the source/drain region.

In another embodiment of the present invention, a nanosheet semiconductor device is presented. The device includes a plurality of channel nanosheets each connected to a source/drain region. The source/drain region includes a front surface, a rear surface, and a V shaped internal recess between the front surface and the rear surface. The device further includes a source/drain region contact that includes an inner portion in physical contact with the V shaped internal recess, a front portion in physical contact with the front surface, and a rear portion in physical contact with the rear surface.

In another embodiment of the present invention, a nanosheet semiconductor device fabrication method is presented. The method includes forming a plurality of channel nanosheets and forming a source/drain region. The source/drain region includes a side surface in physical contact with the plurality of channel nanosheets, a top surface, a front surface, and a rear surface. The method further includes forming a V shaped internal recess within the source/drain region from the top surface between the front surface and the rear surface. The method further includes forming a source/drain region contact within the V shaped internal recess, upon the front surface, and upon the rear surface.

These and other embodiments, features, aspects, and advantages will become better understood with reference to the following description, appended claims, and accompanying drawings.

DETAILED DESCRIPTION

Figure 1:
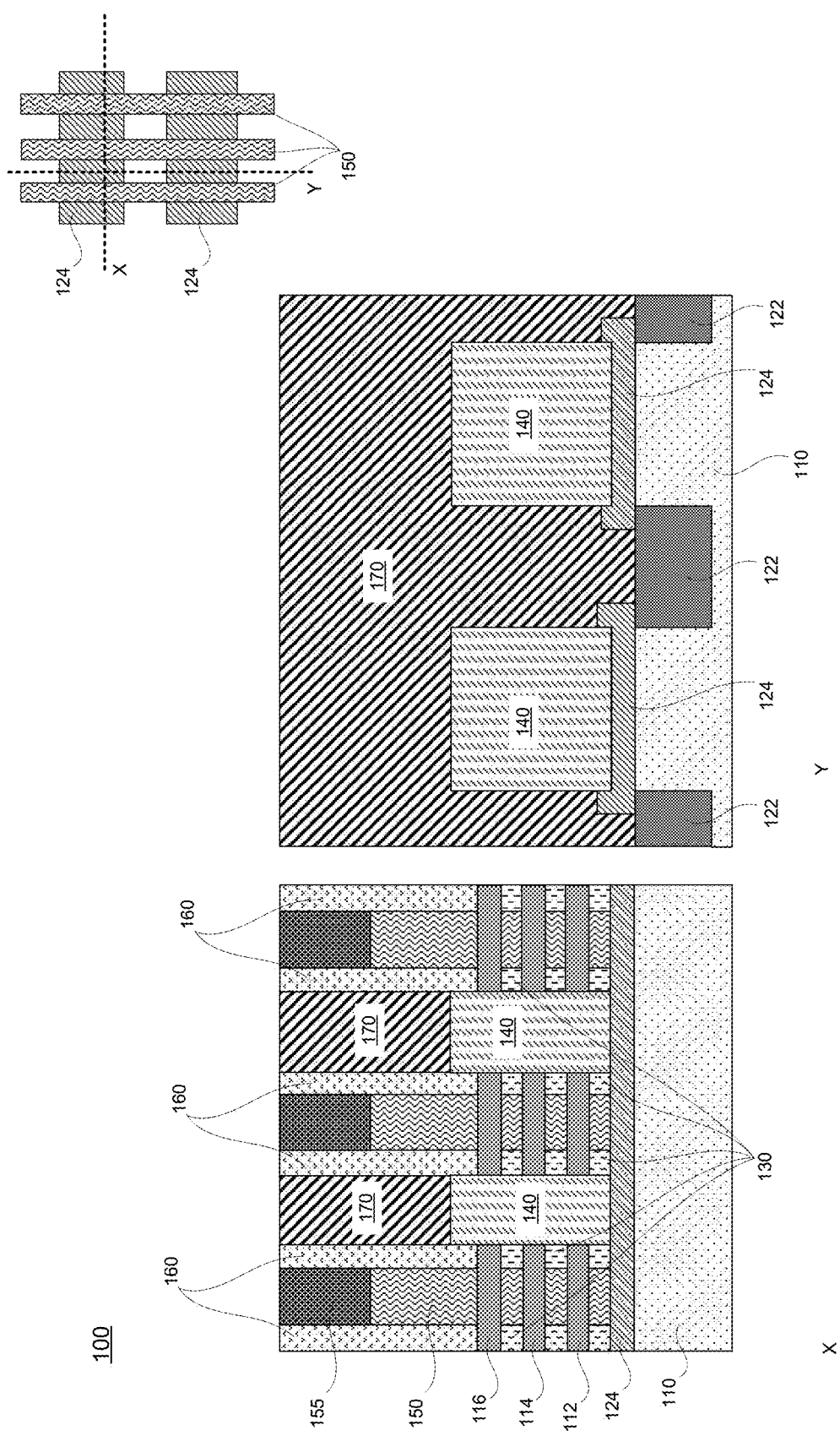
FIG. 1 through FIG. 9 depicts cross-sectional views of a semiconductor device shown after fabrication operation(s), in accordance with one or more embodiments.

Although this detailed description includes examples of how aspects of the invention can be implemented to form an exemplary gate-all-around (GAA) nanosheet FET architecture that includes a wraparound source/drain contact that has a reduced distance from the contact to the FET channel, implementation of the teachings recited herein are not limited to a particular type of FET structure or combination of materials. Rather, embodiments of the present invention are capable of being implemented in conjunction with any other type of transistor device or material, now known or later developed, wherein it is desirable to provide an increased source/drain contact area and a reduced distance between the source/drain contact and the channel.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nano sheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling of CMOS technology.

Although nanosheet channel FET architectures provide increased device density over planar FET architectures, there are still challenges when attempting to fabricate nanosheet FETs that provide the performance characteristics required for a particular application. For example, a wraparound source/drain contact has been found to be potentially attractive for future FET architectures. A shortcoming of known wraparound source/drain contact fabrication processes is that the sacrificial source/drain cap upon the source/drain region typically has Ge diffusion issues during subsequent fabrication stages. A further shortcoming of known wraparound source/drain contacts is the relatively long path (i.e., high resistance) for current to flow from the contact to the channel.

Turning now to an overview of aspects of the invention, embodiments of the invention provide fabrication methods and resulting structures for nano sheet FETs having a wraparound source/drain contact that has a reduced distance from the contact to the FET channel. The wraparound source/drain contact in embodiments of the invention can be any overall shape that is formed upon three or more side perspectives of the underlying source/drain region. For example, the wraparound source/drain contact may be formed upon a front, rear, and top-down surface(s) of the underlying source/drain region. The source/drain region may have top-down top surface and recessed inner surface. A bottom portion of the inner surface may be lower or below the top surface of the source/drain. The bottom portion of the inner surface may be in a central portion and the top surface of the source/drain may be located on the periphery nearest the channel of the associated FET.

Figure 7:
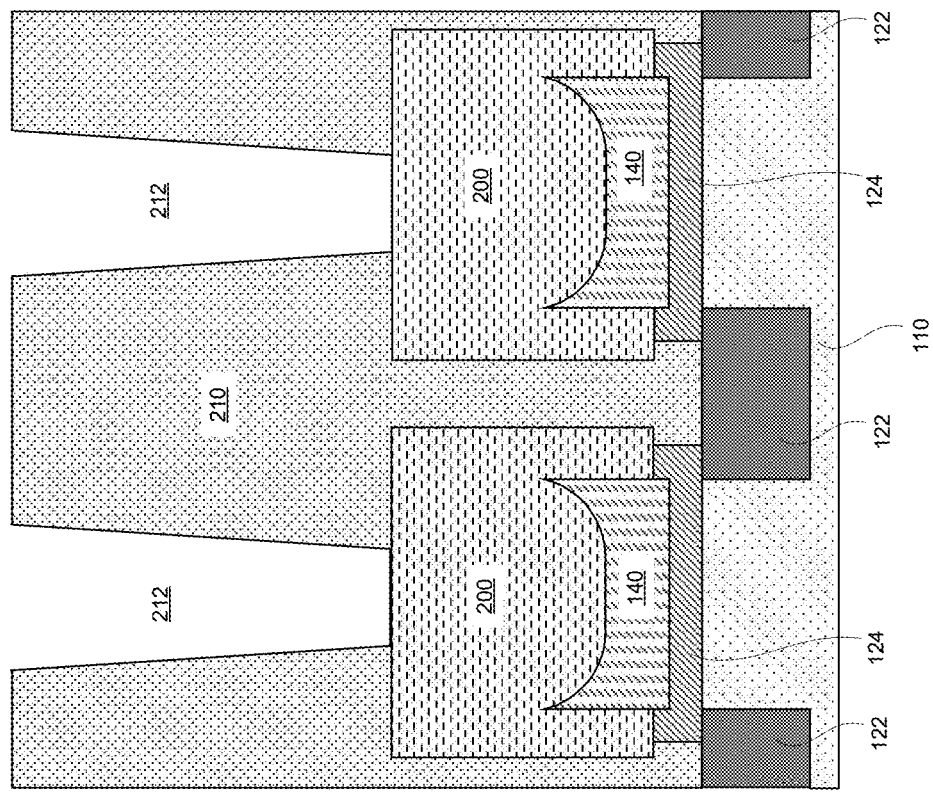
Figure 7:
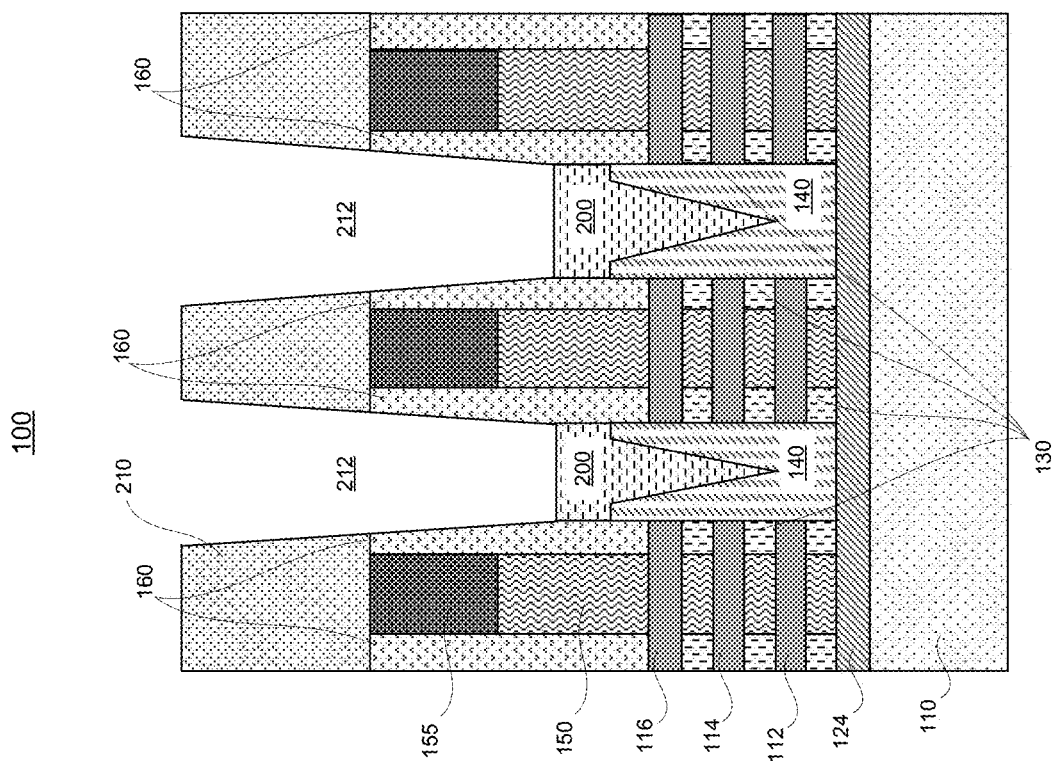
Figure 8:
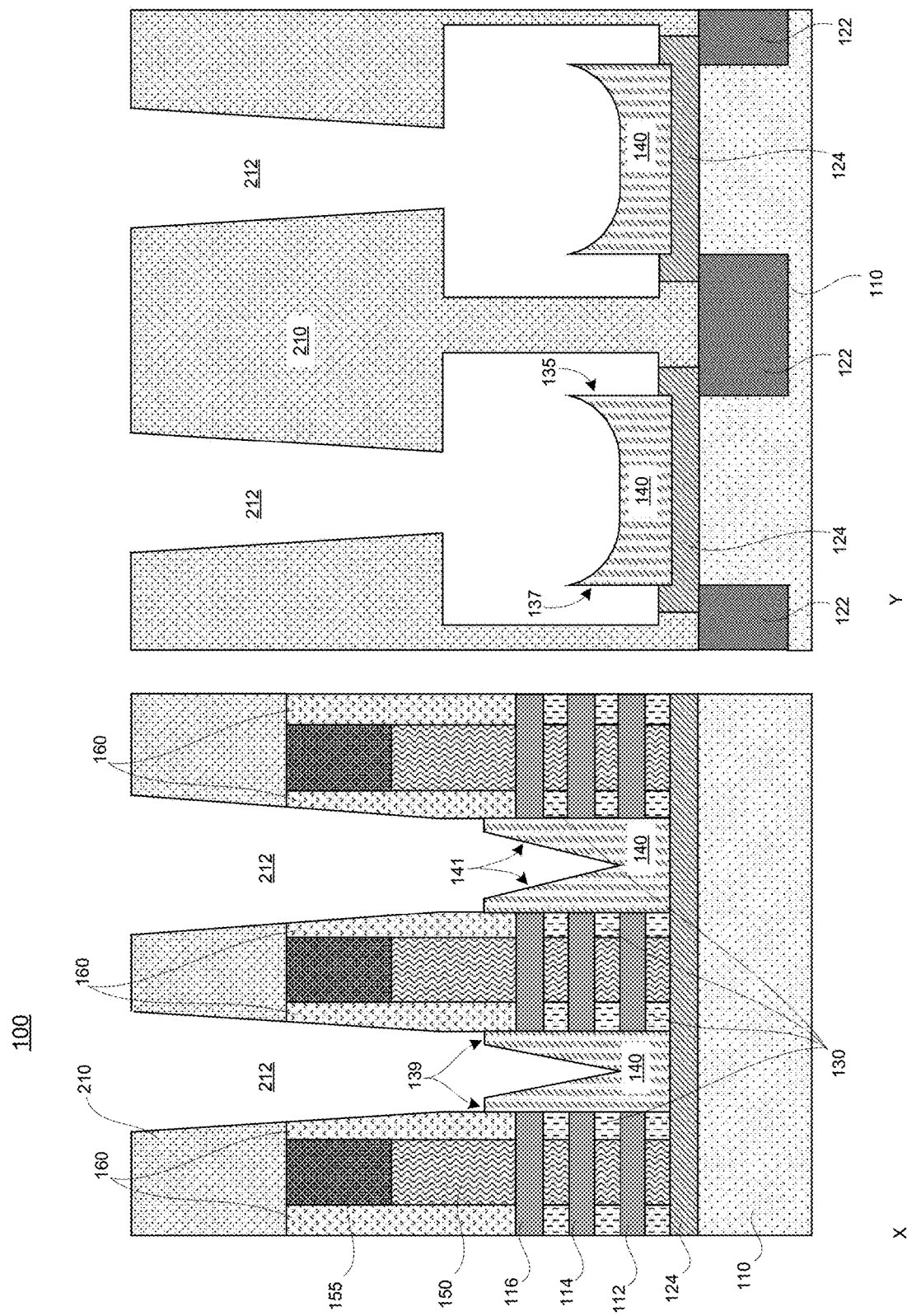
Figure 9:
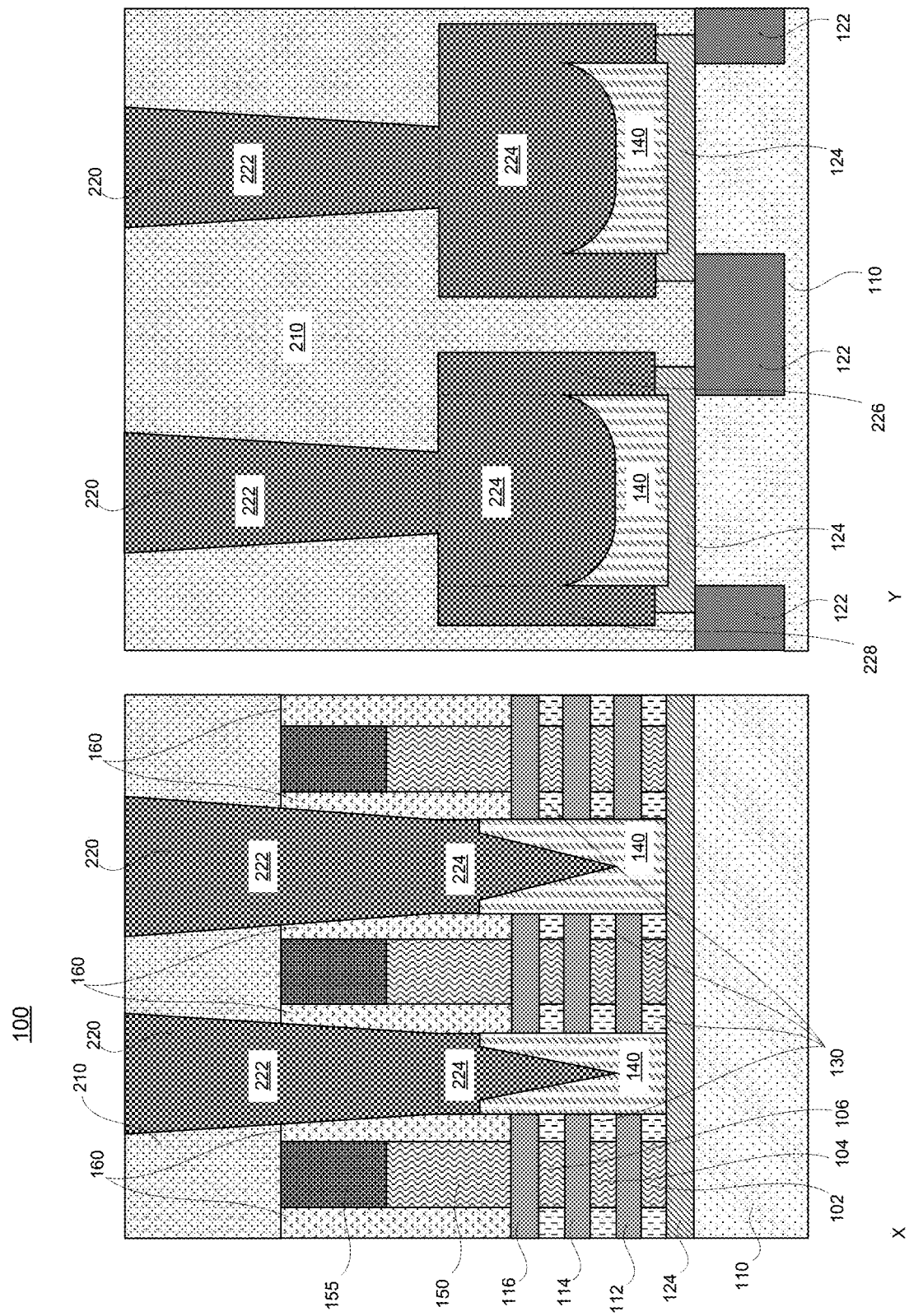

Turning now to a more detailed description of fabrication operations and resulting structures according to aspects of the invention, FIGS. 1-9 depict a nanosheet-based structure 100 after various fabrication operations for forming nanosheet FETs having a wraparound source/drain contact 220 (shown in FIG. 9). For ease of illustration, the fabrication operations depicted in FIGS. 1-9 will be described in the context of forming a nanosheet stack that may include nanosheets 112, 114, 116, etc. The fabrication operations described herein apply equally to the fabrication of any number of nanosheet stacks.

Although the cross-sectional diagrams depicted in FIGS. 1-9 are two-dimensional, it is understood that the diagrams depicted in FIGS. 1-9 represent three-structures. The top-down reference diagram shown in FIG. 1 provides a reference point for the various cross-sectional views (X-view, Y-view) shown in FIGS. 1-9. The X-view is a side view taken across three gates 150, the Y-view is an end view taken a portion of the nanosheets where one of the S/D regions is (or will be) formed.

FIG. 1 depicts cross-sectional views of the nanosheet FET semiconductor device 100 after initial fabrication operations in accordance with aspects of the present invention. The semiconductor device 100 may include substrate 110, bottom dielectric isolator (BDI) regions(s) 124, shallow trench isolation (STI) region(s) 122, replacement gate 150, inner spacers 130, upper gate spacers 160, gate cap 155, source/drain (S/D) region(s) 140, and/or inter layer dielectric (ILD) 170. The semiconductor device 100 may be formed by various fabrication operations described below.

Non-limiting examples of suitable materials for the substrate 110 include Si (silicon), strained Si, SiC (silicon carbide), Ge (germanium), SiGe (silicon germanium), SiGe:C (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb). The substrate 110 can be a bulk semiconductor material that includes Si.

A bottom sacrificial layer, which may subsequently form a BDI layer, may be formed over substrate 110 and a nanosheet stack may be formed over the bottom sacrificial layer. The bottom sacrificial layer may comprise an epitaxial SiGe with high Ge % ranging from 50% to 70%. The nanosheet stack may include an alternating series of SiGe sacrificial nanosheet layers and Si nanosheet layers. The sacrificial SiGe nanosheet layers could be with lower Ge % ranging from 20% to 45%. In accordance with aspects of the invention, the bottom sacrificial layer may be epitaxially grown from the substrate 110 and the nanosheet stack may be epitaxially grown from the bottom sacrificial layer. The alternating layers of the nanosheet stack may be formed by epitaxially growing one layer and then the next until the desired number and desired thicknesses of the nanosheet layers are achieved. Any number of alternating layers can be provided. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments of the invention, the bottom sacrificial layer is SiGe having a Ge percentage that is sufficiently different from the Ge percentage in the SiGe sacrificial nanosheet layers that the bottom sacrificial layer can be selectively removed without also removing the SiGe sacrificial nanosheet layers. In some embodiments of the invention, the bottom sacrificial layer can be SiGe 60%, and the SiGe sacrificial nanosheet layers can be SiGe 30%. The notation "SiGe 60%" is used to indicate that 60% of the SiGe material is Ge and 40% of the SiGe material is Si. In some embodiments of the invention, the Ge percentage in the bottom sacrificial layer layer can range from about 50% to about 70%. In some embodiments of the invention, the Ge percentage in the SiGe sacrificial nanosheet layers can range from about 20% to about 45% as long as the necessary etch selectivity between the bottom sacrificial layer and the SiGe sacrificial nanosheet layers is established.

In some embodiments of the invention, the channel nanosheets 112, 114, and 116 are formed from silicon (Si), and the sacrificial nanosheets are formed from silicon germanium (SiGe). The channel nanosheets 112, 114, and 116 can include, for example, monocrystalline Si. The channel nanosheets 112, 114, and 116 can have a thickness of, for example, from about 4 to about 10 nm, from about 4 to about 7 nm, or of about 7 nm. In embodiments where the sacrificial nanosheets include SiGe, for example, SiGe having a Ge concentration of about 25 atomic percent. The sacrificial nanosheets can have a thickness of, for example, about 12 nm. In some embodiments, the alternating series of sacrificial nanosheets with one channel nanosheets 112, 114, and 116 are formed by epitaxially growing one layer and then the next until the desired number and desired thicknesses of such layers are achieved. Subsequently, a mask layer may be formed upon the top of the sacrificial nanosheet layer.

The sacrificial nanosheets and channel nanosheets 112, 114, and 116 may be patterned from the sacrificial nanosheet layers and shallow trench isolation (STI) regions 122 within substrate 110 may be formed.

Sacrificial nanosheets and channel nanosheets 112, 114, and 116 may be patterned by removing respective undesired portions while retaining respective desired portions. The removal of undesired portions of sacrificial nanosheets, removal of undesired portions of the channel nanosheets 112, 114, and 116, and removal of undesired portions of the bottom sacrificial layer can be accomplished using, for example, conventional lithography and etch process. The removal of such undesired portions may further remove undesired portions of substrate 110 there below.

Desired portions of sacrificial nanosheets, desired portions of the channel nanosheets 112, 114, and 116, and desired portions of the bottom sacrificial layer may be retained.

Shallow trench isolation (STI) regions 122 may be formed by depositing STI material upon the substrate 110 within the STI openings in the substrate 110, followed by STI dielectric CMP and STI dielectric recess. STI regions 122 may electrically isolate components or features of neighboring FETs, or the like, as is known in the art.

Subsequently, a sacrificial gate may be formed. The sacrificial gate may be formed by initially depositing a sacrificial gate liner (e.g., a dielectric, oxide, or the like) upon substrate 110, upon the STI region(s) 122, upon bottom sacrificial layer, and upon the nanosheet stacks. The sacrificial gate may further be formed by subsequently depositing a sacrificial gate material (e.g., a dielectric, amorphous silicon, or the like) upon the sacrificial gate liner.

A gate mask may be formed upon the upper surface of the sacrificial gate. Gate mask may be formed by depositing mask material, such as a hard mask material, in-line with the sacrificial gate. The gate mask may be composed of one or more layers masking materials to protect sacrificial gate and/or other underlying materials during subsequent processing of structure 100. In particular, gate mask can include, e.g., a silicon nitride, silicon oxide hard mask, or combination of both.

The gate mask, sacrificial gate material, and sacrificial gate liner may be patterned using conventional lithography and etch process to form a sacrificial gate structure. Each sacrificial gate structure can initially be formed on targeted regions of bulk nanosheet material to define the length of an individual transistor structure, and to provide sacrificial material for yielding targeted transistor structure in subsequent processing. According to an example, each sacrificial gate with gate mask thereupon, can have a height of between approximately 50 nm and approximately 200 nm, and a length of between approximately 15 nm and approximately 200 nm.

Subsequently, the bottom sacrificial layer may be selectively removed and may therefore form cavities between the substrate and nanosheet stack. Gate spacers 160 may be formed by a conformal deposition followed by anisotropic etch. The gate spacer 160 dielectric material may also fill the cavity between the substrate and nanosheet stack, thereby forming BDI region 124. Subsequently, the nanosheet stack that is not protected by sacrificial gate or gate spacer 160 may be recessed, sacrificial nanosheet may be selectively recessed, inner spacers 130 may be formed inside the recesses, source/drain regions 140 may be formed, and inter-layer dielectric (ILD) 170 may be formed. ILD 170 be formed with any suitable dielectric materials, including but not limited to, silicon oxide, carbon doped silicon oxide, fluorine doped silicon oxide, a low-k dielectric (k is the relative dielectric constant and low-k means a k value less than 5). In some embodiments, the ILD 170 comprises multiple dielectric materials such as a silicon nitride liner and silicon oxide fill.

Gate spacers 160 may laterally abut sacrificial gate and gate mask. Gate spacers 160 may be formed, e.g., by a combination of deposition and etching, over the initial structure of nanosheet stack and laterally adjacent to sacrificial gate and gate mask. Gate spacers 160 may be comprised of a variety of different materials, such as silicon nitride, SiBCN, SiNC, SiN, SiCO, and SiNOC, etc., and they may each be made of the same or different materials.

Lateral recessing of alternating sacrificial nanosheets can be provided, e.g., by application of a wet etchant selective to the composition of the sacrificial nanosheets (e.g., SiGe or similar crystalline semiconductors), and which leaves other structures (e.g., substrate 110, channel nanosheets 112, 114, and 116, etc.) substantially intact.

Inner spacers 130 may be formed by depositing an insulative material, such as a dielectric, to pinch off these previously formed recesses to yield a inner spacer 130 positioned therewithin, (e.g., between alternating channel nanosheets 112, 114, and 116 within the nanosheet stack). Inner spacer 130 can be positioned upon the sidewall of the sacrificial gate, vertically between channel nanosheets 112, 114, and 116 of each nanosheet stack and vertically between channel nanosheet 112 and BDI 124.

S/D region 140 may be formed by epitaxially growing a source/drain epitaxial region between respective pairs of nanosheet stacks, e.g., from exposed sidewalls of channel nanosheets 112, 114, and 116. In some embodiments, the S/D region 140 is formed by in-situ doped epitaxial growth. In some embodiments, epitaxial growth and/or deposition processes may be selective to forming on semiconductor surfaces, and may not deposit material on dielectric surfaces, such as silicon dioxide or silicon nitride surfaces (e.g., nanosheet stacks, channel nanosheet spacers 130, gate spacers 160, etc.).

Suitable n-type dopants include but are not limited to phosphorous (P), and suitable p-type dopants include but are not limited to boron (B). The use of an in-situ doping process is merely an example. For instance, one may instead employ an ex-situ process to introduce dopants into the source and drains. Other doping techniques can be used to incorporate dopants in the bottom source/drain region. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. In preferred embodiments the source drain epitaxial growth conditions that promote in-situ boron doped SiGe for pMOS and phosphorus or arsenic doped silicon or Si:C for nMOS. The doping concentration in S/D region 140 can be in the range of $1 \times 10^{19}$ cm$^{-3}$ to $2 \times 10^{21}$ cm$^{-3}$, or preferably between $2 \times 10^{20}$ cm$^{-3}$ to $7 \times 10^{20}$ cm$^{-3}$.

ILD 170 may be formed by depositing an appropriate dielectric material, as is known in the art, upon S/D regions 140, upon STI region(s) 122, upon BDI region(s) 124, and/or upon gate spacers 160 associated with neighboring nanosheet stacks.

Subsequently, the sacrificial gate and sacrificial nanosheets may be removed, the channel nanosheets 112, 114, 116 there below are processed, and replacement gate 150 may be formed. The channel nanosheets 112, 114, 116 may be processed and replacement gates 150 may be formed by exposing and removing the sacrificial gates, removing the remaining sacrificial nanosheets, and forming replacement gate 150 around the exposed portions of the channel nanosheets 112, 114, and 116.

Each replacement gate 150 can comprise a gate dielectric and gate conductor(s). Gate dielectric can comprise any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. The gate dielectric material can be formed by any suitable deposition process or the like. In some embodiments, the gate dielectric has a thickness ranging from 1 nm to 5 nm, although less thickness and greater thickness are also conceived. Gate conductor can comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO2), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material may further comprise dopants that are incorporated during or after deposition. In some embodiments, the gate may further comprise a workfunction setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

Various known techniques may be utilized to process the nanosheets within the gate region or, in other words, the exposed portions of the nanosheets 112, 114, 116, exposed when the sacrificial gate is removed. For example, the sacrificial gate and gate cap thereupon may be removed. Such removal may lateral expose the remaining sacrificial nanosheets in the gate region. Subsequently, the exposed sacrificial nanosheets may be removed laterally to expose the channel nanosheets 112, 114, and 116. The exposed portions of the channel nanosheets 112, 114, and 116 may be processed by forming high-k layer may be formed around the exposed channel nanosheets 112, 114, and 116, and various one or more work function materials may be deposited upon the high-k dielectric, as is known in the art. Subsequently, replacement gates 150, such as metal gates, may be formed around the processed channel nanosheets 112, 114, and 116, upon the substrate 110, upon the SIT regions 122, and upon the BDI regions 124, etc., between gates spacers 160 and inner spacers 170. The replacement gate 150 may be further recessed and a dielectric gate cap 155 can be formed over the recessed gate 150, as is depicted.

Figure 2:
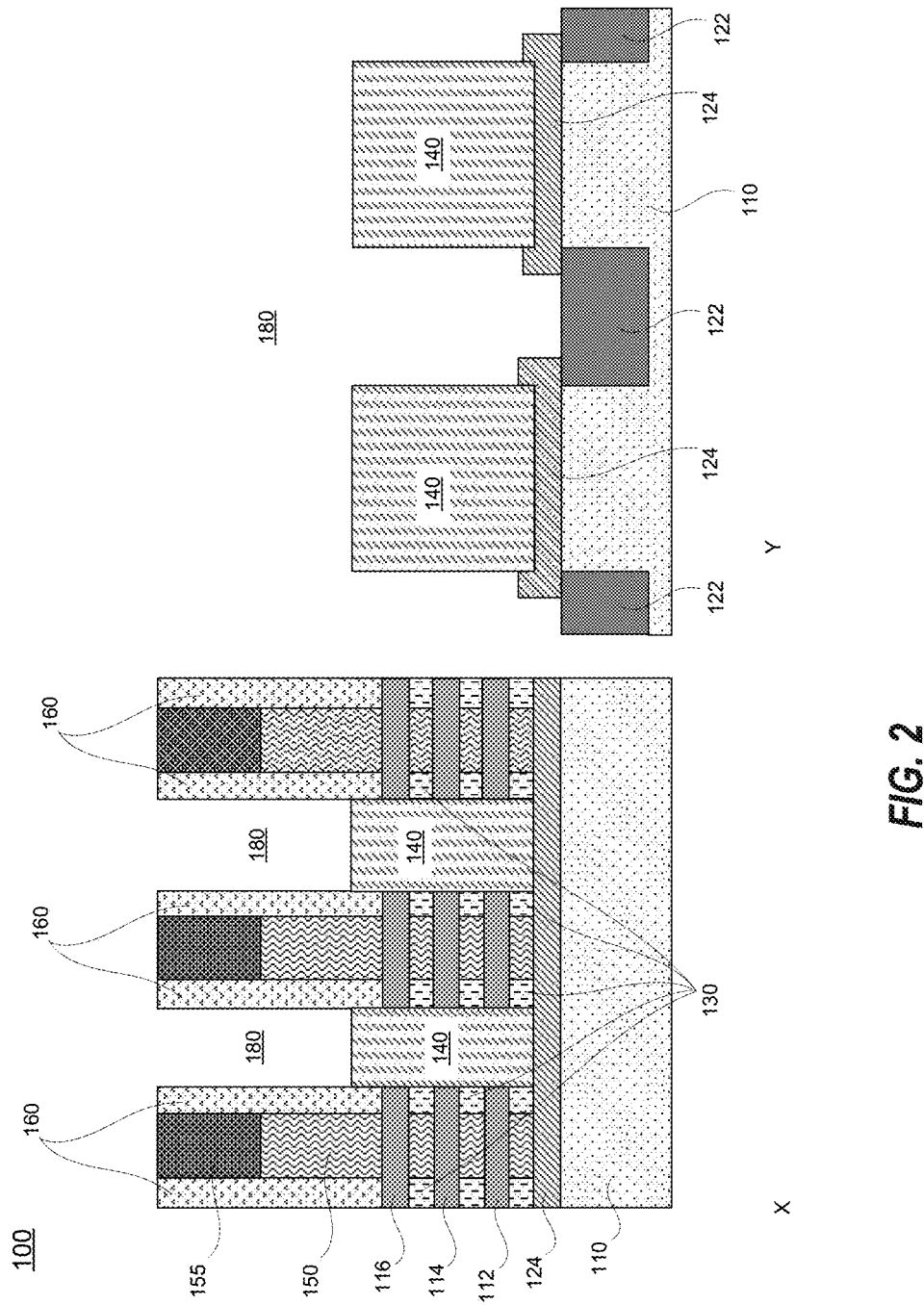

FIG. 2 depicts semiconductor device 100 after a fabrication operation. During the present fabrication stage, ILD 170 is at least partially recessed between neighboring gate spacers 160 that are associated with different neighboring replacement gates 150. The recessing of ILD 170 may form S/D opening 180 and may expose the upper surface of S/D region(s) 140, partially expose the BDI regions(2) 124, and expose portions of the STI region(s) 122, as depicted in the Y cross-section.

ILD 170 may be recessed by a selective etch process that removes ILD 170 material selective to a particular surface, such as the S/D region 140, BDI region 124, and/or the SUI region 122.

Figure 3:
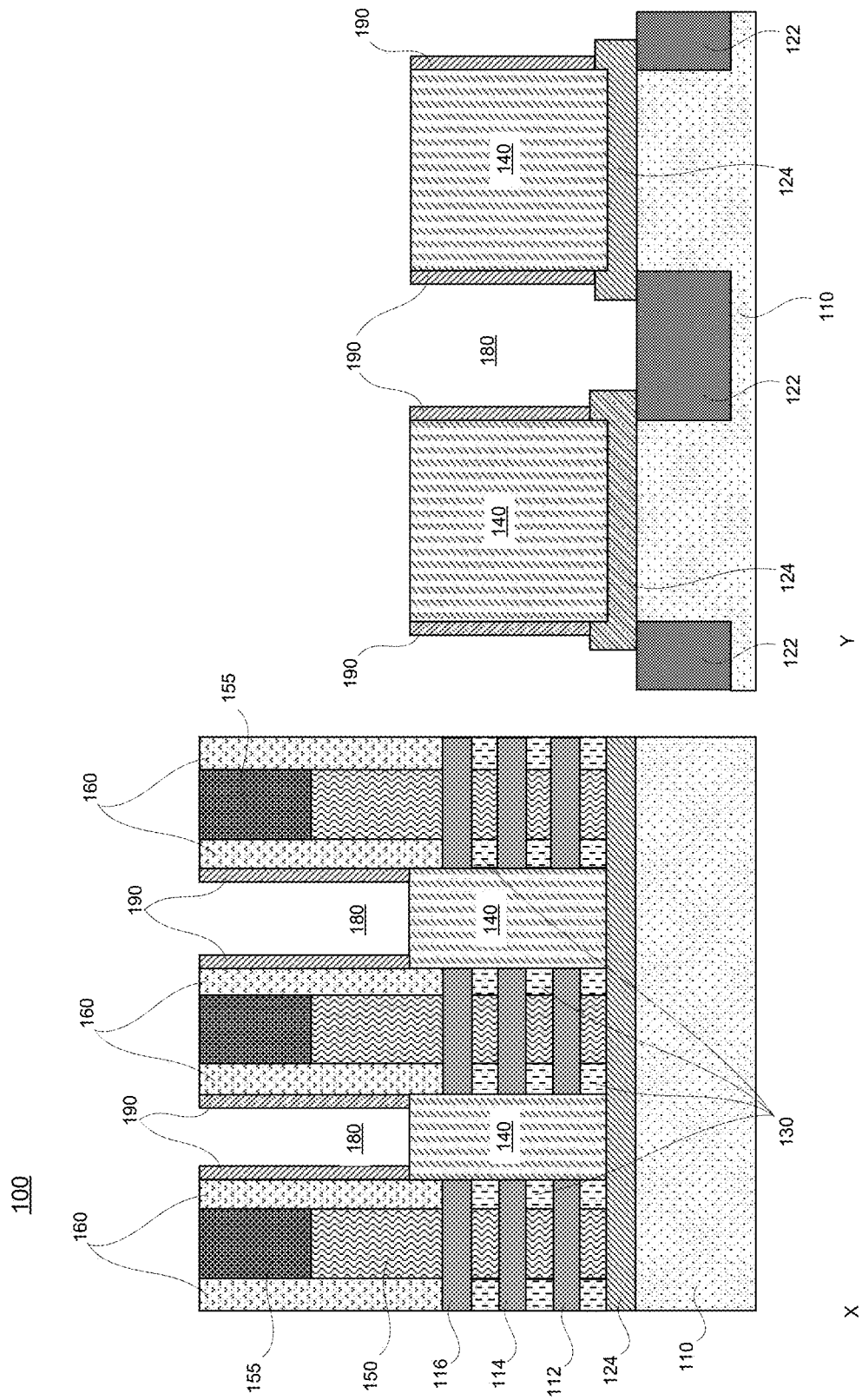

FIG. 3 depicts semiconductor device 100 after a fabrication operation. During the present fabrication stage, sacrificial spacers 190 are formed. Sacrificial spacer(s) 190 may be formed upon the respective inner facing sidewalls of the neighboring gate spacers 190 within S/D opening 180. This sacrificial spacer(s) 190 may further be formed upon the top surface of the underlying S/D region 140. Other sacrificial spacer(s) 190 may be formed upon the respective front and rear sidewalls of S/D region 140 within S/D opening 180. Such sacrificial spacer(s) 190 may further be formed upon the BDI region 124 associated with the particular S/D region 140 there below.

Sacrificial spacer 190 may be formed by forming a blanket spacer layer upon the STI region(s) 122, upon DBI region(s) 124, upon S/D region(s) 140, and upon gate spacer 160 sidewalls within S/D opening 180. This sacrificial spacer 190 layer can have a thickness of from about 1 nm to about 12 nm, although other thicknesses are within the contemplated scope. The sacrificial spacer 190 layer can be materials which can be selectively removed with respect to surrounding materials, as is known in the art, such as $TiO_x$, AlOx, SiC, etc. The sacrificial spacer 190 may be formed by conformal deposition (e.g. by ALD) followed by anisotropic etch to remove it from horizontal surfaces, such that sacrificial spacers 190 are formed upon S/D region 140 and upon a respective gate spacer 160 sidewall, such that a sacrificial spacer 190 is formed upon the rear surface of S/D region 140, and such that a sacrificial spacer 190 is formed upon a front surface of S/D region 140.

The sacrificial spacer 190 layer be shaped by removing horizontal portions of sacrificial spacer 190 layer at horizontal surfaces. The horizontal portions of sacrificial spacer 190 layer may be removed by known etching techniques, such as an anisotropic reactive ion etch (RIE). The desired vertical portions of sacrificial spacer 190 layer may be associated with or juxtaposed against respective sidewalls of gate spacers 160, S/D region 140, etc. Further, undesired horizontal portions of sacrificial spacer 190 layer may be associated with or above respective STI region(s) 122, S/D region 140 upper surface(s), or the like. The retained sacrificial spacer 190 layer portions may therefore be effectively formed upon the vertical sidewalls of the respective aforementioned features.

Figure 4:
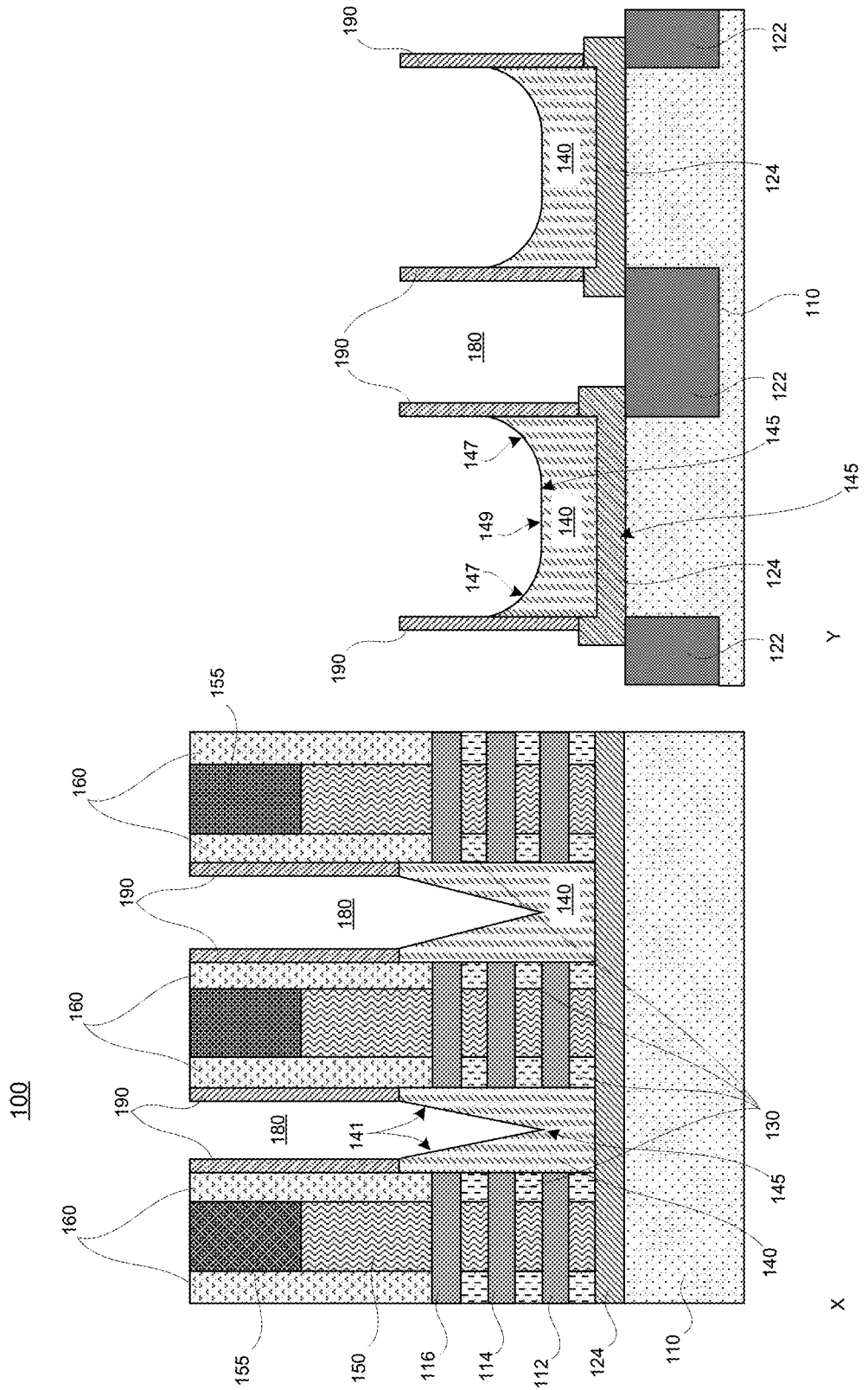

FIG. 4 depicts semiconductor device 100 after a fabrication operation. During the present fabrication stage, S/D region 140 is shaped or partially recessed between and under the sacrificial spacers 190. In some embodiments, S/D region 140 etching processes may include a plasma etching method, such as an ion beam etching (IBE) process.

As is depicted in the X cross-section, subsequent to the shaping of S/D region 140, S/D region 140 may include a flat or horizontal upper surface that is protected from the etching process and is generally located underneath the sacrificial spacers 190 that are upon the facing sidewalls of the neighboring gate structures. As a result of the shaping or partial removal of S/D region 140 material, S/D region 140 may include a sloped internal planar surface 141 that extends generally downward from the flat or horizontal upper surface and a positively sloped internal planar surface 141 that extends upward to the flat or horizontal upper surface. These two sloped internal surfaces 141 may have a generally "V" shape, as depicted in the X cross section. Neighboring sloped internal planar surfaces 141 may meet at a central curved or concave lower internal vertex 145. The central lower internal vertex 145 may be created by the two neighboring sloped internal planar surfaces 141 meeting at an acute angle (e.g. the bottom intersection of the "V" shape, etc.). The internal recess of the S/D region 140 created by the formation of the sloped internal surfaces 141, the concave lower internal vertex 145, may be referred herein as a S/D region 140 internal recess.

As is depicted in the Y cross-section, subsequent to the shaping of S/D region 140, the central lower internal vertex 145 may include a flat or horizontal lower vertex 149 and may include a arced lower vertex 147 that extends generally downward from the inner facing front sacrificial spacer 190 or rear sacrificial spacer 190 surfaces, respectively to the flat or horizontal lower vertex 149. The flat or horizontal lower vertex 149 may be between each arced lower vertex 147. For example, between the inner facing front sacrificial spacer 190 and rear sacrificial spacer 190 surfaces, respectively, the vertex 149 and the arched vertex 147 may have a concave shape (i.e., like the inside of a bowl). Due to the enlarged S/D opening 180 downward and due to the shaping of S/D region 140, the flat or horizontal lower vertex 149 is generally below the S/D region 140 flat or horizontal upper surface.

Figure 5:
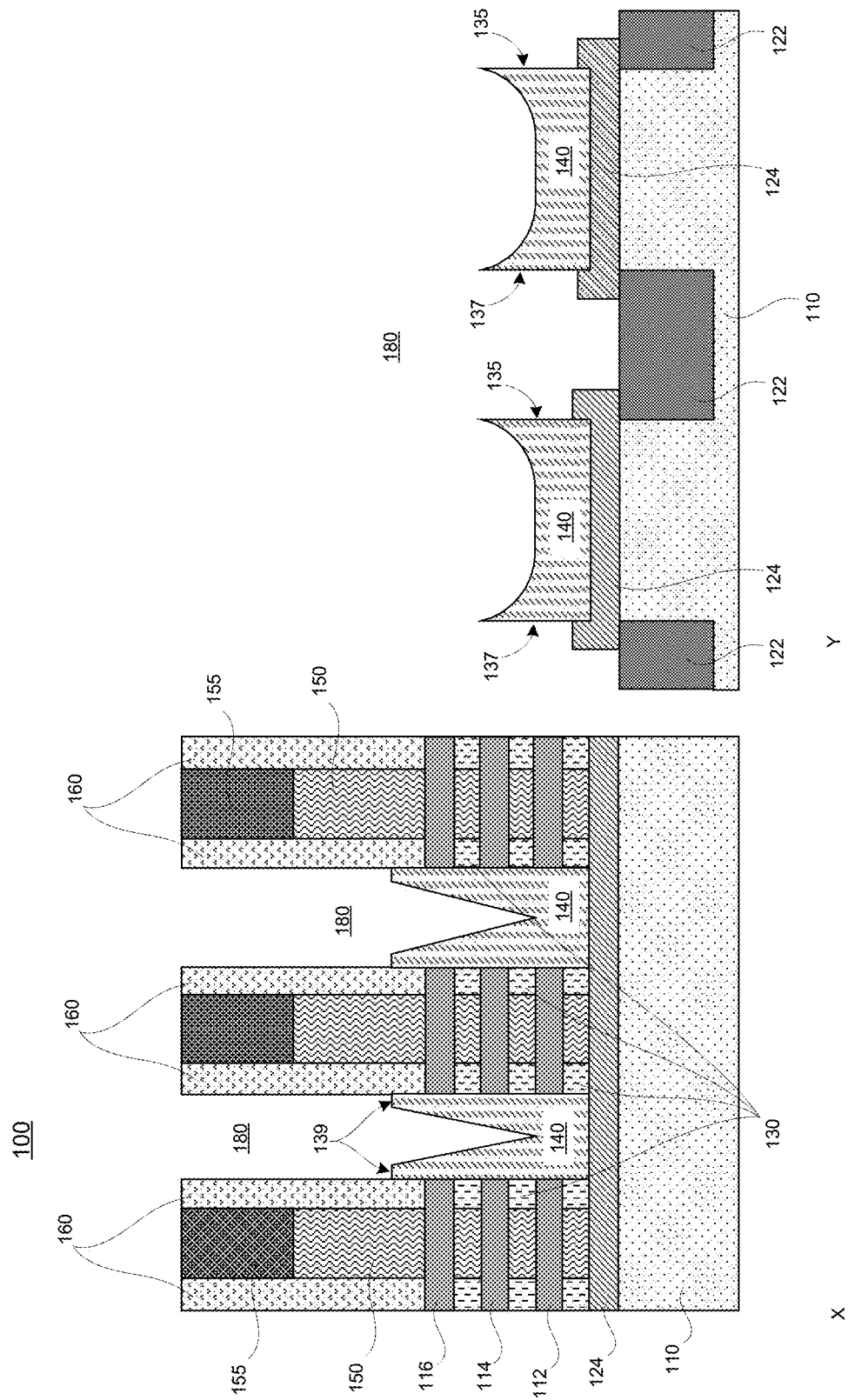

FIG. 5 depicts semiconductor device 100 after a fabrication operation. During the present fabrication stage, sacrificial spacers 190 are removed. Sacrificial spacers 190 may be removed by a selective etch process whereby the etchant removes the material of spacer 190 while the materials of S/D regions 140, gate spacers 160, gate cap 155, and the like are retained.

Removal of sacrificial spacers 190 may expose the flat or horizontal upper surface 139 of S/D region 140, may expose the rear surface 137 of S/D region 140, and may expose the front surface 135 of the S/D region 140. As depicted, the flat or horizontal upper surface 139 of S/D region 140 may be above the top nanosheet 116. Front surface 135 and rear surface 137 may be appear as e.g., a vertically orientated rectangle, similar and shorter relative to the shape of S/D region 140, as depicted in the X cross-section of FIG. 1, when taking a normal view thereof. In other words, the arced "V" shaped opening within S/D region 140, as is exemplarity depicted in the X cross-section and Y cross-section of FIG. 5, is internal to a generally rectangular cuboid outside perimeter S/D region 140, etc.). As such, the relative top surface of front surface 135 and/or rear surface 137 may be below the top surface 139, as depicted.

Figure 6:
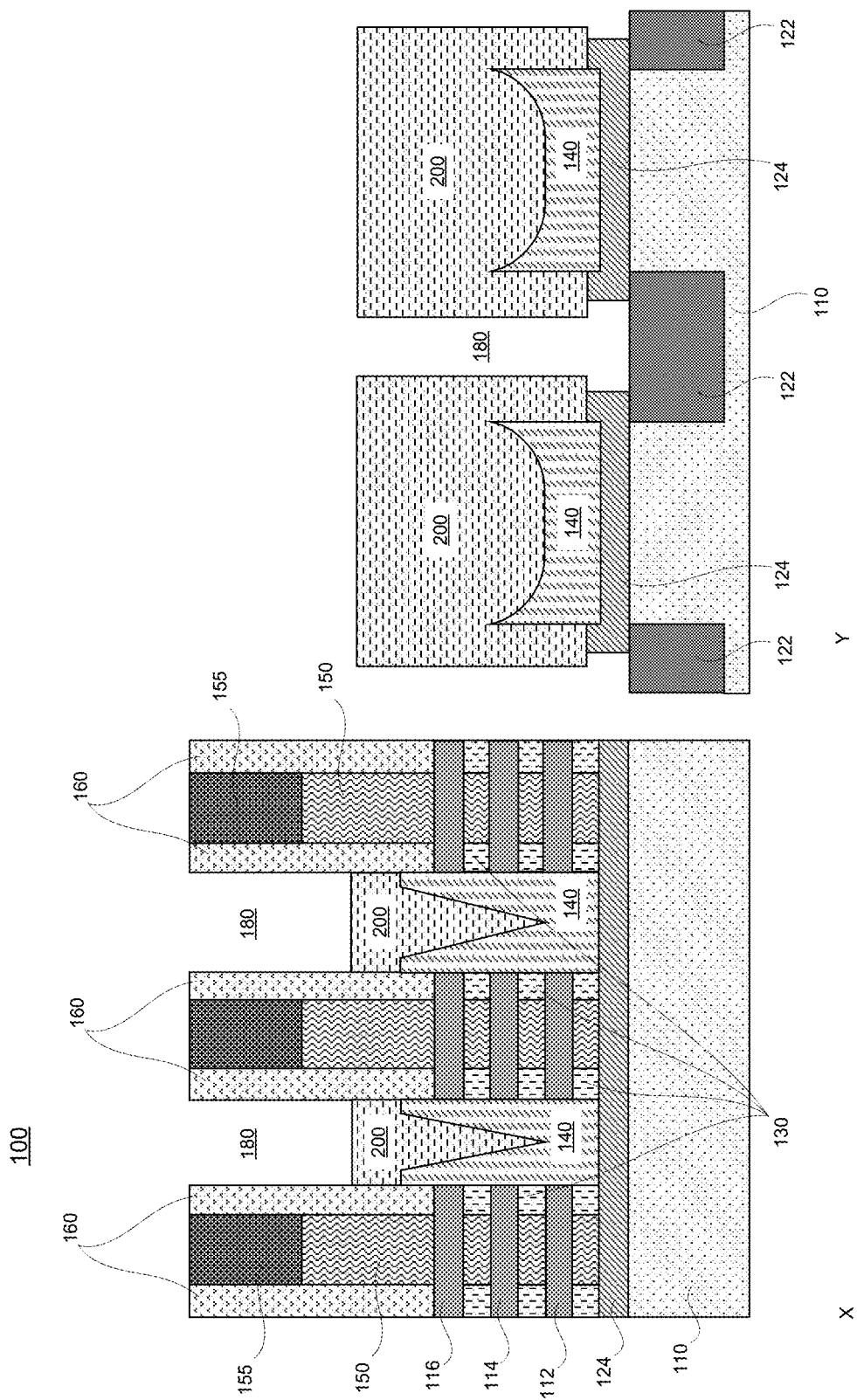

FIG. 6 depicts semiconductor device 100 after a fabrication operation. During the present fabrication stage, sacrificial S/D region 200 is formed. Sacrificial S/D region 200 may be formed by epitaxy growing sacrificial material from S/D region 140 within S/D opening 180.

Sacrificial S/D region 200 may be grown from sloped internal planar surfaces 141 of S/D region 140. Similarly, sacrificial S/D region 200 may be grown from the flat or horizontal upper surface 139 of S/D region 140. Likewise, sacrificial S/D region 200 may be grown from the rear surface 137 and/or the front surface 135 of S/D region 140. The top surface of sacrificial S/D region 200 may be between the top nanosheet 116 and the top surface of replacement gate 150.

In some embodiments of the invention, the sacrificial S/D region 200 is SiGe having a Ge percentage that is sufficiently different from the Ge percentage in the S/D region 140 such that the sacrificial S/D region 200 can be selectively removed without also removing the S/D region 140.

In some embodiments of the invention, the sacrificial S/D region 200 can be SiGe 90%, and the S/D region 200 can be Si with little or no Ge. In some embodiments of the invention, the sacrificial S/D region 200 can be SiGe 90%, and the SiGe S/D region 200 can be SiGe 30%.

In some embodiments of the invention, the Ge percentage in the SiGe sacrificial S/D region 200 can range from about 70% to about 90%. In some embodiments of the invention, the Ge percentage in the SiGe S/D region 200 can range from about 0% to about 45% as long as the necessary etch selectivity between the sacrificial S/D region 200 and the S/D region 140 is established.

Because replacement gate 150 has already been formed, high temperature anneal processes (such as high-k PDA, high-k reliability anneal) may not be needed as compared to other known sacrificial S/D region architectures and associated Ge diffusion into surrounding material(s) may be reduced.

FIG. 7 depicts semiconductor device 100 after a fabrication operation. During the present fabrication stage, dielectric fill material 210 may be formed and S/D opening 212 may be formed within the dielectric fill material 210.

In embodiment of the invention, the fill material 210 is an interlayer dielectric (ILD), which can be a nitride or an oxide material, or combination of both. For example, ILD material 210 may be formed upon the sacrificial S/D region 200 within the remaining S/D opening 180 thereby filling S/D opening 180 and may be formed upon the top surface of gate spacers 160 and the gate cap 155 (if present) or the replacement gate 150 (if gate cap 155 is not present).

In an embodiment, S/D opening 212 may be formed within the fill material 210 between neighboring replacement gates 150 and may expose a portion of the top surface of an underlying sacrificial S/D region 200. The S/D opening 212 may remove sufficient fill material 210 above the sacrificial S/D region 200 top surface, as depicted in the Y cross-section and expose at least a portion of sacrificial S/D region 200.

Utilizing known lithography and etching, etc. techniques, undesired portions of the ILD material may be removed between neighboring replacement gates 150, thereby forming S/D opening 212. The etchant may be selective to the sacrificial S/D region 200 and may only remove fill material 210 above the top surface of sacrificial S/D region 200. The S/D opening 212 may further expose at least the facing sidewall of gate spacer 160 associated with the first (e.g., left) replacement gate 150 and the outer facing sidewall of gate spacer 160 associated with the second neighboring (e.g., right) replacement gate 150.

FIG. 8 depicts semiconductor device 100 after a fabrication operation. During the present fabrication stage, S/D opening 212 may be enlarged by removing sacrificial S/D region 200.

Utilizing known etching, etc. techniques, the sacrificial S/D region 200 may be removed between neighboring replacement gates 150, thereby enlarging S/D opening 212. The etchant may be selective to the sacrificial S/D region 200 DBI region 124, and/or fill material 212 and may only remove sacrificial S/D region 200.

Upon removal of the sacrificial S/D region 200, the enlarged S/D opening 212 may further expose at least the flat or horizontal upper surface 139, may expose sloped internal planar surfaces 141, may expose the rear surface 137, and may expose the front surface 135 of the S/D region 140. The enlarged S/D opening 212 may further expose a portion of the upper surface of BDI region 124 that is located outside the front surface and rear surface of the S/D region 140.

FIG. 9 depicts semiconductor device 100 after a fabrication operation. During the present fabrication stage, wraparound S/D contact 220 may be formed within S/D opening 212.

Wraparound S/D contact 220 may be formed by depositing a conductive material within S/D contact opening 212. Exemplary wraparound S/D contact 220 materials may include a silicide liner, such as Ti, Ni, NiPt, etc., followed by adhesion metal liner, such as TiN, TaN, TiC, etc., followed by conductive low resistance metal fill, such as W, Co, Ru, Cu, etc. After metal deposition, a contact metal CMP process can be used to remove excessive contact metals that are deposited above the fill material 210.

The wraparound S/D contact 220 may have an upper portion 222, a lower portion 224, a front portion 226, and a rear portion 228. The upper portion 222 may be shaped as a pillar, conical cone, or the like. The diameter of an upper surface of the upper portion 222 that may be coincident with the top surface of fill material 210 may be larger than the diameter of the bottom portion of lower portion 222. A sidewall of upper portion 222 may be coplanar with an outer facing sidewall of gate spacer 160 associated with a first replacement gate 150 and an outer facing sidewall of a neighboring gate spacer 160 associated with a second neighboring replacement gate 150. Such sidewalls may be substantially vertical. In other implementations, such sidewalls may be sloped, as depicted.

Lower portion 224 may comprise a rectangular cuboid (or the like) upper portion and a triangular prism lower portion. As depicted in the X cross-section, a sidewall of the rectangular cuboid may be coplanar with an outer facing sidewall of gate spacer 160 associated with the first replacement gate 150 and an outer facing sidewall of a neighboring gate spacer 160 associated with a second neighboring replacement gate 150. Such sidewalls may be substantially vertical. In other implementations, such sidewalls may be sloped. A bottom surface of the rectangular cuboid may physically contact the upper surface 139 of S/D region 140. The triangular prism lower portion may extend downward from the rectangular cuboid. The triangular prism lower portion may have a sidewall surface in contact with sloped internal planar surfaces 141 of S/D region 140. The triangular prism lower portion may have a vertex of such sidewall surfaces that is generally pointed downward toward substrate 110 and may be in contact and may be coincident with the central lower internal vertex 145 of S/D region 140. As such, the central lower vertex 145 of S/D region 140 may also be referred herein as the vertex 145 of the triangular prism portion of the S/D region contact 220.

The lower vertex 145 of S/D region contact 220 may be the bottom most or lowest portion of S/D contact 220 and may be above the lower or bottom surface of S/D region 140, as depicted. The lower vertex 145 of S/D region contact 220 may be below one or more, two or more, or the like of the channel nanosheets 112, 114, and 116. For example, the lower vertex 145 of S/D region contact 220 may be between the lower surface of channel nanosheet 112 (e.g., the bottom most channel nanosheet) and the lower surface of channel nanosheet 114 (e.g., the nanosheet directly above the bottom most channel nanosheet) be preferred to decrease the distance between the S/D region contact 220 and the majority of the channel nanosheets without risking the S/D region contact 220 being formed too low and extending into the DBI region 124 and/or substrate 110. In this manner, the distance between such channel nanosheets 112, 114, and 116 and the S/D region contact 220 may be reduced relative to a similar S/D contact with a planar lower horizontal surface upon a non-recessed S/D region.

Front portion 226 and rear portion 228 may extend from the front side and rear side of lower portion 224, respectively. Front portion 226 and rear portion 228 may each be a rectangular cuboid (or the like) and may be generally substantially vertically orientated. The front portion 226 and rear portion 228 may have the same width of the S/D region 140, as viewed in the X cross-section. Alternatively, such sidewalls of front portion 226 and rear portion 228 may be inset from the sidewalls of the S/D region 140.

The wraparound S/D contact 220 may physically contact and wraparound the associated S/D region 140. For example, as depicted in the X cross-section, lower portion 224 may physically contact each sloped internal planar surface 141 of the S/D region 140 and may physically contact the upper surface 139 of the S/D region 140. Further, front portion 226 and rear portion 228 of S/D contact 220 may contact the front surface 135 or rear surface 137 of S/D region 140, respectively Due to at least the sloped inward surfaces 141 of S/D region 140, the contact surface area interface between the S/D region 140 and the S/D contact 220 may be increased relative to e.g., a contact interface surface area of a similar S/D region with a continuous horizontal planar top surface. Further, due to at least the sloped inward surfaces 141 of S/D region 140, the S/D contact 220 has a reduced dimension to the channel nanosheets 112, 114, and 116 relative a similar height S/D region that has a continuous horizontal planar top surface. Because of the reduced dimension to the channel nanosheets 112, 114, and 116, there may be decreased resistance to current that flows from the S/D contact 220 to the channel nanosheets 112, 114, and 116.

Figure 10:
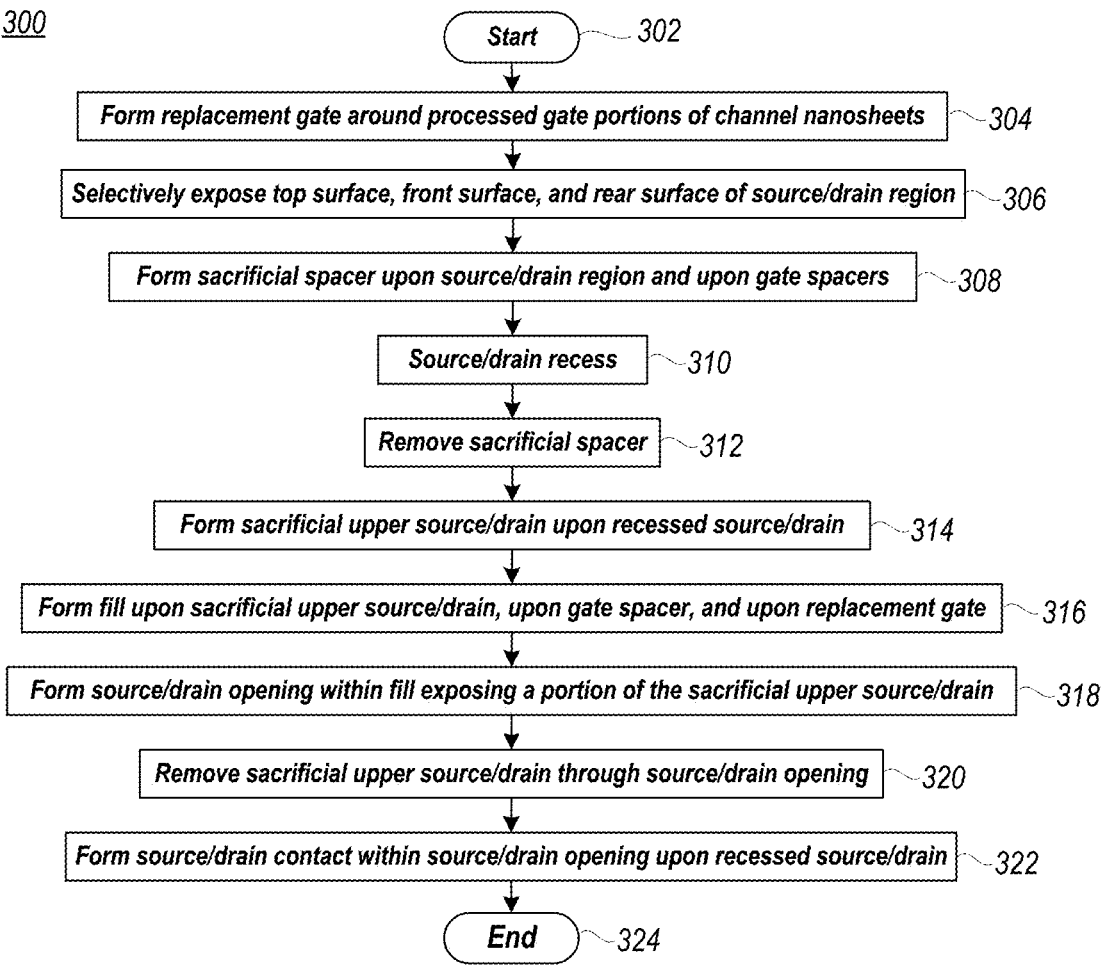
FIG. 10 is a flow diagram illustrating a semiconductor device fabrication method, in accordance with one or more embodiments.

FIG. 10 depicts a flow diagram illustrating a method 300 of fabricating semiconductor device 100 that includes a wraparound contact 220 that has a reduced distance from the contact to the nanosheet FET channel nanosheets 112, 114, and 116, according to one or more embodiments of the present invention. Method 300 may begin at block 302 and include of known method steps of forming a nanosheet FET. At a particular fabrication stage, and a block 304, a replacement gate structure, such as replacement gate 150, may be formed between gate spacers 160 and around the processed channel nanosheets 112, 114, and 116.

At block 306, ILD 170 may be at least partially removed to expose the top surface, front surface, and rear surface of S/D region 140. At block 308, a sacrificial spacer 190 may be formed upon the S/D region 140 and upon gate spacers 160 associated with neighboring replacement gates 150. For example, sacrificial spacer 190 may be formed upon the front surface and rear surface of S/D region 140. Further, sacrificial spacer 190 may be formed upon the top surface of S/D region as well as a sidewall of gate spacer 160. At block 310, a S/D recess is formed within the S/D region 140. For example, S/D recess 180 is enlarged downward into S/D region 140 by partially removing S/D region 140 material between sacrificial spacers 190.

At block 312, the sacrificial spacers 190 may be removed at block 314 a sacrificial upper S/D region 200 may be formed upon and around the recessed S/D region 140.

At block 316, fill material 210 may be formed upon the sacrificial upper S/D region 200, upon gate spacers 160, and upon the associated replacement gates. At block 318, S/D opening 212 may be formed within the fill material 210. The S/D opening 212 may expose a portion of the upper surface (s) of the sacrificial upper S/D region 200.

At block 320, the sacrificial upper S/D region 200 may be removed through the S/D opening 212 and at block 322, S/D contact 220 may be formed within the S/D opening 212 upon and around the recessed S/D region 140. Method 300 may end at block 324.

The method flow diagram depicted herein is exemplary. There can be many variations to the diagram or operations described therein without departing from the spirit of the embodiments. For instance, the operations can be performed in a differing order, or operations can be added, deleted or modified. All of these variations are considered a part of the claimed embodiments.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A nanosheet semiconductor device comprising:
   a plurality of channel nanosheets each connected to a source/drain region;
   a gate surrounding the plurality of channel nanosheets;
   the source/drain region comprising a front surface, a rear surface, a top surface, and an internal recess comprising two or more sloped internal surfaces extending downward from the top surface; and
   a source/drain region contact in physical contact with the internal recess, in physical contact with the front surface, and in physical contact with the rear surface of the source/drain region.

2. The nanosheet semiconductor device of claim 1, wherein the two or more sloped internal surfaces intersect at a bottom vertex of the internal recess.

3. The nanosheet semiconductor device of claim 2, wherein the bottom vertex is concave.

4. The nanosheet semiconductor device of claim 3, wherein the source/drain region contact is further in physical contact with the top surface of the source/drain region.

5. The nanosheet semiconductor device of claim 1, wherein the source/drain region contact comprises a conical upper portion and a lower portion, wherein the lower portion comprises a rectangular cuboid portion above a triangular prism portion, wherein the rectangular cuboid portion is in physical contact with the top surface of the source/drain region, and wherein the triangular prism portion is in physical contact with the internal recess of the source/drain region.

6. The nanosheet semiconductor device of claim 5, wherein the source/drain region contact further comprises a front portion that extends downward from the rectangular cuboid portion and a rear portion that extends downward from the rectangular cuboid portion.

7. The nanosheet semiconductor device of claim 6, wherein the front portion of the source/drain region contact is in physical contact with the front surface of the source/ drain region and wherein the rear portion of the source/drain region contact is in physical contact with the rear surface of the source/drain region.

8. The nanosheet semiconductor device of claim 1, wherein the source/drain region contact extends below one or more of the plurality of channel nanosheets.

9. The nanosheet semiconductor device of claim 1, wherein the source/drain region contact extends below two or more of the plurality of channel nanosheets.

10. A nanosheet semiconductor device comprising:
a plurality of channel nanosheets each connected to a source/drain region, the source/drain region comprising a front surface, a rear surface, and a V shaped internal recess between the front surface and the rear surface; and
a source/drain region contact comprising an inner portion in physical contact with the V shaped internal recess, a front portion in physical contact with the front surface, and a rear portion in physical contact with the rear surface.

11. The nanosheet semiconductor device of claim 10, wherein the inner portion of the source/drain region contact comprises a bottom vertex at a bottom of the V shaped internal recess.

12. The nanosheet semiconductor device of claim 11, wherein the bottom vertex is concave between the front portion and the rear portion.

13. The nanosheet semiconductor device of claim 12, wherein the source/drain region further comprises a top surface.

14. The nanosheet semiconductor device of claim 10, wherein the source/drain region contact further comprises a rectangular cuboid portion in physical contact with an upper surface of the source/drain region.

15. The nanosheet semiconductor device of claim 13, wherein a distance between a bottom most channel nanosheet and the bottom vertex is less than a distance between the bottom most channel nanosheet and the top surface of the source/drain region.

16. The nanosheet semiconductor device of claim 11, wherein the bottom vertex is below a top surface of a top channel nanosheet.

17. The nanosheet semiconductor device of claim 11, wherein the bottom vertex is below one or more of the plurality of channel nanosheets.

18. The nanosheet semiconductor device of claim 11, wherein the bottom vertex is below two or more of the plurality of channel nanosheets.

19. A semiconductor device comprising:
a source/drain region comprising a side surface in physical contact with a plurality of nanosheets, a front surface, a rear surface, a top surface, and an internal recess that extends from the front surface to the rear surface and comprises two or more sloped internal surfaces extending downward from the top surface; and
a source/drain region contact in physical contact with the internal recess.

20. The semiconductor device of claim 19, wherein the source/drain region contact is also in physical contact with the front surface of the source/drain region and the rear surface of the source/drain region.

* * * * *